United States Patent
Feng

(10) Patent No.: US 8,068,284 B2
(45) Date of Patent: *Nov. 29, 2011

(54) MICROLENS ALIGNMENT PROCEDURES IN CMOS IMAGE SENSOR DESIGN

(75) Inventor: Chen Feng, Bothell, WA (US)

(73) Assignee: Intellectual Ventures II LLC, Wilmington, DE (US)

( * ) Notice: Subject to any disclaimer, the term of this patent is extended or adjusted under 35 U.S.C. 154(b) by 178 days.

This patent is subject to a terminal disclaimer.

(21) Appl. No.: 12/489,147

(22) Filed: Jun. 22, 2009

(65) Prior Publication Data

US 2010/0146477 A1 Jun. 10, 2010

Related U.S. Application Data

(60) Continuation of application No. 11/313,976, filed on Dec. 20, 2005, now Pat. No. 7,564,629, which is a division of application No. 11/004,465, filed on Dec. 2, 2004, now abandoned.

(51) Int. Cl.
*G02B 27/10* (2006.01)

(52) U.S. Cl. ..................................... 359/619

(58) Field of Classification Search .......... 359/618–620; 250/208.1, 216; 257/292, 432
See application file for complete search history.

(56) References Cited

U.S. PATENT DOCUMENTS

| | | | |
|---|---|---|---|
| 4,739,394 A | 4/1988 | Oda et al. | |
| 5,142,357 A | 8/1992 | Lipton et al. | |
| 5,323,052 A | 6/1994 | Koyama | |
| 5,324,930 A | 6/1994 | Jech, Jr. | |
| 5,422,285 A | 6/1995 | Ishibe | |
| 5,659,357 A | 8/1997 | Miyano | |
| 5,798,847 A | 8/1998 | Aerts | |
| 5,838,023 A | 11/1998 | Goel et al. | |
| 6,008,511 A | 12/1999 | Tokumitsu et al. | |
| 6,246,043 B1 | 6/2001 | Merrill | |
| 6,274,917 B1 | 8/2001 | Fan et al. | |
| 6,411,331 B1 | 6/2002 | Sansom-Wai et al. | |

(Continued)

FOREIGN PATENT DOCUMENTS

JP WO2004027875 1/2004

OTHER PUBLICATIONS

Office Action issued in U.S. Appl. No. 11/314,452 mailed Jun. 30, 2006.

(Continued)

*Primary Examiner* — Alicia M Harrington
(74) *Attorney, Agent, or Firm* — McAndrews, Held & Malloy Ltd.

(57) ABSTRACT

A method for aligning a microlens array in a sensor die to resolve non-symmetric brightness distribution and color balance of the image captured by the sensor die. The method includes performing a pre-simulation to simulate a microlens array alignment in a silicon die and to determine a shrink-factor and de-centering values, calculating the error in a real product's alignment in process and image offset, performing a post simulation based on offset calculation on the real product and re-design of the microlens alignment, and repeating the steps of calculating the error and performing the post-simulation until a satisfactory brightness distribution is obtained. The sensor die has sensor pixels, each pixel comprising a photodiode and a microlens for directing incoming light rays to the photodiode, wherein optical axis of the microlens is shifted with respect to optical axis of the photodiode by a preset amount determined by at least one iteration of alignment process.

23 Claims, 10 Drawing Sheets

U.S. PATENT DOCUMENTS

| | | |
|---|---|---|
| 6,437,307 B1 | 8/2002 | Bloss |
| 6,747,808 B2 | 6/2004 | Voss et al. |
| 6,781,632 B1 | 8/2004 | Ide |
| 6,838,715 B1 | 1/2005 | Bencuya et al. |
| 6,884,985 B2 | 4/2005 | Raynor |
| 6,903,391 B2 | 6/2005 | Takeuchi et al. |
| 6,995,800 B2 | 2/2006 | Takahashi et al. |
| 7,006,135 B2 | 2/2006 | Ishimaru et al. |
| 7,019,279 B2 | 3/2006 | Oda et al. |
| 7,049,168 B2 | 5/2006 | Findlater et al. |
| 7,161,129 B2 | 1/2007 | Galambos et al. |
| 7,236,190 B2 | 6/2007 | Yanof et al. |
| 2001/0036305 A1 | 11/2001 | Jun |
| 2001/0056337 A1 | 12/2001 | Kurita |
| 2003/0006363 A1 | 1/2003 | Campbell et al. |
| 2003/0011686 A1 | 1/2003 | Higuchi |
| 2003/0071271 A1 | 4/2003 | Suzuki et al. |
| 2003/0173599 A1 | 9/2003 | Nakai |
| 2004/0135899 A1 | 7/2004 | Suemoto |
| 2004/0140564 A1 | 7/2004 | Lee et al. |
| 2004/0165097 A1 | 8/2004 | Drowley et al. |
| 2005/0010621 A1 | 1/2005 | Pinto et al. |
| 2005/0061951 A1 | 3/2005 | Campbell et al. |
| 2005/0122408 A1 | 6/2005 | Park et al. |
| 2005/0174473 A1 | 8/2005 | Morgan et al. |
| 2006/0006438 A1 | 1/2006 | Maruyama |
| 2006/0113622 A1 | 6/2006 | Adkisson et al. |

OTHER PUBLICATIONS

Office Action issued in U.S. Appl. No. 11/314,452 mailed Jan. 5, 2007.

Office Action issued in U.S. Appl. No. 11/314,452 mailed Aug. 9, 2007.

Office Action issued in U.S. Appl. No. 11/314,452 mailed Mar. 17, 2008.

Office Action issued in U.S. Appl. No. 11/044,376 mailed Mar. 25, 2008.

Office Action issued in U.S. Appl. No. 11/044,376 mailed Mar. 13, 2006.

Office Action issued in U.S. Appl. No. 11/044,376 mailed Jan. 19, 2007.

Office Action issued in U.S. Appl. No. 11/003,824 mailed Dec. 12, 2007.

Office Action issued in U.S. Appl. No. 11/004,465 mailed Mar. 28, 2006.

Office Action issued in U.S. Appl. No. 11/004,465 mailed Aug. 28, 2006.

Office Action issued in U.S. Appl. No. 11/004,465 mailed Jan. 25, 2007.

Office Action issued in U.S. Appl. No. 11/004,465 mailed Jan. 11, 2008.

Office Action issued in U.S. Appl. No. 10/976,693 mailed Oct. 18, 2007.

Nikon, AF Micro-Nikkor 60 mm f/2.8D 1993, Release; http://nikonimaging.com/global/products/lens/af/micro/af_micro60mmf_28d/index.htm.

Office Action issued in U.S. Appl. No. 10/976,693 mailed Jun. 11, 2008.

Notice of Allowance issued in U.S. Appl. No. 11/003,824, mailed Jul. 15, 2008.

Office Action issued in U.S. Appl. No. 11/004,465 mailed Oct. 2, 2008.

Office Action issued in U.S. Appl. No. 11/004,376 mailed Feb. 4, 2009.

Office Action issued in U.S. Appl. No. 11/314,452 mailed Dec. 22, 2008.

Notice of Allowance issued in U.S. Appl. No. 11/313,976, mailed Mar. 24, 2009.

MICROLENS ALIGNMENT PROCEDURES IN CMOS IMAGE SENSOR DESIGN

CROSS-REFERENCE TO RELATED APPLICATIONS/INCORPORATION BY REFERENCE

This application is a continuation of U.S. application Ser. No. 11/313,976, filed Dec. 20, 2005, which is a divisional of U.S. application Ser. No. 11/004,465, filed Dec. 2, 2004. The disclosure of U.S. application Ser. No. 11/313,976 is hereby incorporated herein by reference in its entirety.

BACKGROUND

1. Field of the Invention

The present invention relates to CMOS image sensor design and more particularly to microlens alignment procedures of CMOS image sensors.

2. Background of the Related Art

There has been an increase of digital image devices using CMOS image sensors. A conventional CMOS image sensor requires a matching imaging lens to have certain ray angle incident on its sensor surface to generate acceptable image data output. In an effort to mitigate the ray angle requirement, the CMOS sensor may be customized to accept incident rays at large angles, especially for the pixels at corners and edges thereof.

One common practice of CMOS sensor customization is shifting a microlens array of the sensor to match the incident rays at large angles. However, in the application of the shifting technique, the non-symmetric nature of the CMOS sensor pixel layout may create non-symmetric brightness distribution over the image output, where the non-symmetric nature may be more pronounced at the corners and edges of the image output. In addition, such non-symmetric brightness may be accompanied by improper color balance, i.e., the color of the image of a white light source is not white over the entire image output.

To resolve the appearance of non-symmetric brightness distribution over the image output, the existing approaches have attempted several symmetric layouts for each pixel of the CMOS sensor. Such approaches may impose many limitations and restrictions to a layout designer and some tradeoff may be necessary to accommodate the symmetric layout with additional silicon real estate. In addition, the entire CMOS pixel layout may be modified upon unsatisfactory image output, which requires lengthy and expensive turn-around processes. Furthermore, the existing approaches cannot correct the non-symmetric nature that may be rooted in other sources, such as chemical contamination occurred during the CMOS process for producing a silicon die, electrical field generated by metal layers of the CMOS sensor, imperfect masks used in the CMOS process and other unknown sources. Thus, there is a need for an improved method for resolving non-symmetric brightness distribution.

SUMMARY

The present invention provides a method for aligning a microlens array in a sensor die to resolve non-symmetric brightness distribution and improper color balance of images captured by the sensor die.

In one aspect of the present invention, a method for aligning a microlens array in a sensor die includes the steps of (a) performing a pre-simulation to simulate a microlens array alignment in a silicon die and to determine a shrink-factor; (b) designing a new photo-mask for the microlens array based on the shrink-factor; (c) producing a sample silicon die using the new photo-mask; (d) capturing an image of a collimated white light source using the sample silicon die; (e) evaluating uniformity of brightness distribution of the image; and in case of unsatisfactory brightness distribution; (f) calculating error in alignment of the sample silicon die and a de-centering value; (g) performing a post-simulation based on the error to tune the shrink-factor and the de-centering value; (h) designing a new photo-mask for the microlens array based on the shrink-factor and the de-centering value; and (i) repeating the steps (c)-(h) until a satisfactory brightness distribution is obtained.

In another aspect of the present invention, a sensor die for digital imaging includes: a processing area; and a sensing area, comprising: a plurality of sensor pixels, comprising: a silicon substrate having a photodiode and a plurality of passive components; a first insulting layer on top of the silicon substrate; a plurality of metal layers on top of the first insulating layer, the photodiode and the plurality of passive components connected to at least one of the plurality of metal layers; a plurality of middle insulating layers, each of the plurality of middle insulating layers sandwiched between two neighboring ones of the plurality of metal layers; a first insulating planar layer on top of the plurality of metal layers; a color filter; a second insulating planar layer on top of the color filter; and a microlens to direct incoming light to the photodiode through the color filter; wherein an optical axis of the microlens is shifted with respect to an optical axis of the photodiode by a preset amount determined by at least one iteration of alignment process, each of the at least one iteration including a pre-simulation to determine a shrink-factor and a post-simulation to tune the shrink-factor.

In yet another aspect of the present invention, an imaging device includes: a sensor die for digital imaging, comprising: a processing area; and a sensing area, comprising: a plurality of sensor pixels, each of the plurality of sensor pixels comprising: a silicon substrate having a photodiode and a plurality of passive components; a first insulting layer on top of the silicon substrate; a plurality of metal layers on top of the first insulating layer, the photodiode and the plurality of passive components connected to at least one of the plurality of metal layers; a plurality of middle insulating layers, each of the plurality of middle insulating layers sandwiched between two neighboring ones of the plurality of insulating layers; a first insulating planar layer on top of the plurality of metal layers; a color filter; a second insulating planar layer on top of the color filter; and a microlens to direct incoming light to the photodiode through the color filter; wherein an optical axis of the microlens is shifted with respect to an optical axis of the photodiode by a preset amount determined by at least one iterative alignment process, each of the at least one iterative alignment process including a pre-simulation to determine a shrink-factor and a post-simulation to tune the shrink-factor.

In still another aspect of the present invention, a computer readable medium carries one or more sequences of instructions for aligning a microlens array in a sensor die, wherein execution of the one or more sequences of instructions by one or more processors causes the one or more processors to perform the steps of: (a) performing a pre-simulation to simulate a microlens array alignment in a silicon die and to determine a shrink-factor; (b) designing a new photo-mask for the microlens array based on the shrink-factor; (c) producing a sample silicon die using the new photo-mask; (d) capturing an image of a collimated white light source using the sample silicon die; (e) evaluating uniformity of brightness distribution of the image; and in case of unsatisfactory brightness distribution; (f) calculating error in alignment of the sample silicon die and an image de-centering value; (g) performing a post-simulation based on the error to tune the shrink-factor; (h) designing a new photo-mask for the microlens array based on the shrink-factor and the de-centering value; and (i) repeating the steps (c)-(h) until a satisfactory brightness distribution is obtained.

In another aspect of the present invention, a system for aligning a microlens array in a sensor die includes: means for performing a pre-simulation to simulate a microlens array alignment in a silicon die and to determine a shrink-factor; means for designing a new photo-mask for the microlens array based on the shrink-factor; means for producing a sample silicon die using the new photo-mask; means for capturing an image of a collimated white light source using the sample silicon die; means for evaluating uniformity of brightness distribution of the image; and in case of unsatisfactory brightness distribution; means for calculating error in alignment of the sample silicon die and an image brightness center offset; means for performing a post-simulation based on the error to tune the shrink-factor; means for designing a new photo-mask for the microlens array based on the shrink-factor and the image brightness center offset; and means for repeating the steps of producing a sample silicon die to the step of designing a new photo-mask until a satisfactory brightness distribution is obtained.

These and other features, aspects and advantages of the present invention will become better understood with reference to the following drawings, description and claims.

DETAILED DESCRIPTION

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described.

It must be noted that, as used herein and in the appended claims, the singular forms "a", "an", and "the" include plural referents unless the context clearly dictates otherwise. Thus, for example, reference to "a microlens" includes a plurality of such microlens, i.e., microlens array, and equivalents thereof known to those skilled in the art, and so forth.

One common practice of CMOS sensor customization is shifting a microlens array of the sensor to match incident rays at large angles. However, in the application of the shifting technique, the non-symmetric nature of the CMOS sensor layout may create non-symmetric brightness distribution over the image output, where the non-symmetric nature may be more pronounced at the corners and edges of the image output. In addition, such non-symmetric brightness may be accompanied by improper color balance, i.e., the color of the image of a white light source is not white over the entire image output. The present inventor provides a simple, yet effective way to resolve the appearance of non-symmetric brightness in the image by introducing off-center alignment (aligned with de-centering values) between a microlens array and a sensor pixel array of the CMOS sensor.

Figure 1:
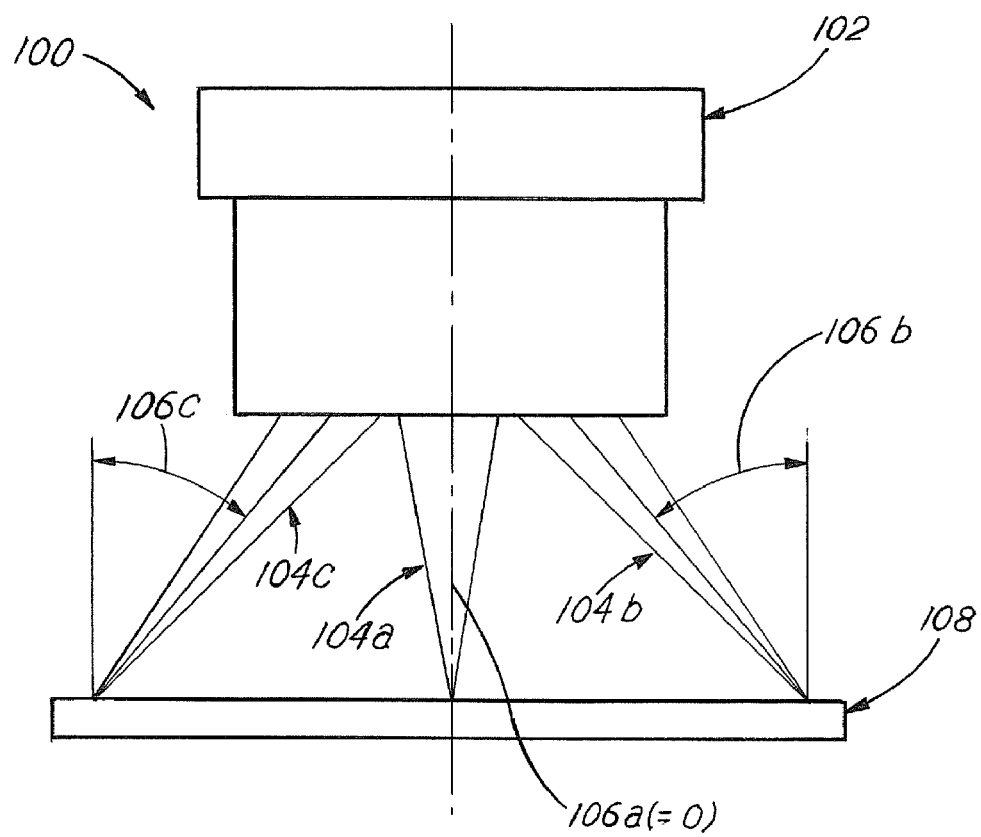
FIG. 1 is a schematic diagram of an image module assembly in accordance with one embodiment of the present teachings.

FIG. 1 is a schematic diagram of an image module assembly 100 (or, equivalently a lens/sensor assembly) in accordance with one embodiment of the present teachings. The lens/sensor assembly 100 may be included in digital image devices, such as digital image camera and cellular phone with imaging capabilities. As illustrated, the lens/sensor assembly 100 includes: a sensor die 108 as an image sensor; and a lens assembly 102 having several pieces of lenses and iris (no shown in FIG. 1 for simplicity) assembled in a lens barrel, the lens assembly forming an image on the surface of the sensor die 108. In one embodiment, the width and length of the sensor die 108 is about, but not limited to, 5 mm.

Optical rays 104a-c, exemplary optical rays from the lens assembly 102, are directed to sensor pixels (the sensor pixels will be explained later) at the center, near the left edge and near the right edge of the sensor die 108, respectively, and angled with respect to the surface normal of the sensor die 108 by chief ray angles 106a-c, respectively. The chief ray angles 106b and 106c may be as large as 30 degrees, while the chief ray angle 106a is about zero degree.

Figure 2A:
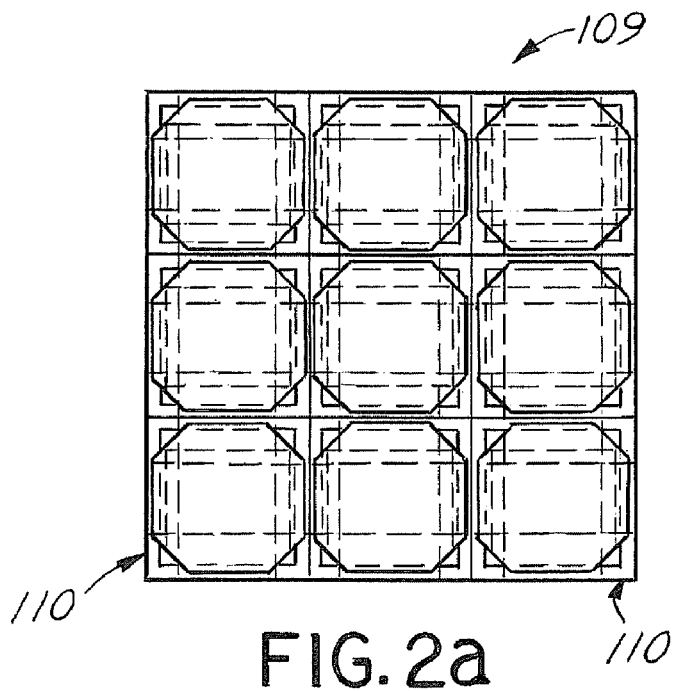
FIG. 2a is a top view of a portion of a silicon die in accordance with one embodiment of the present teachings.
Figure 2C:
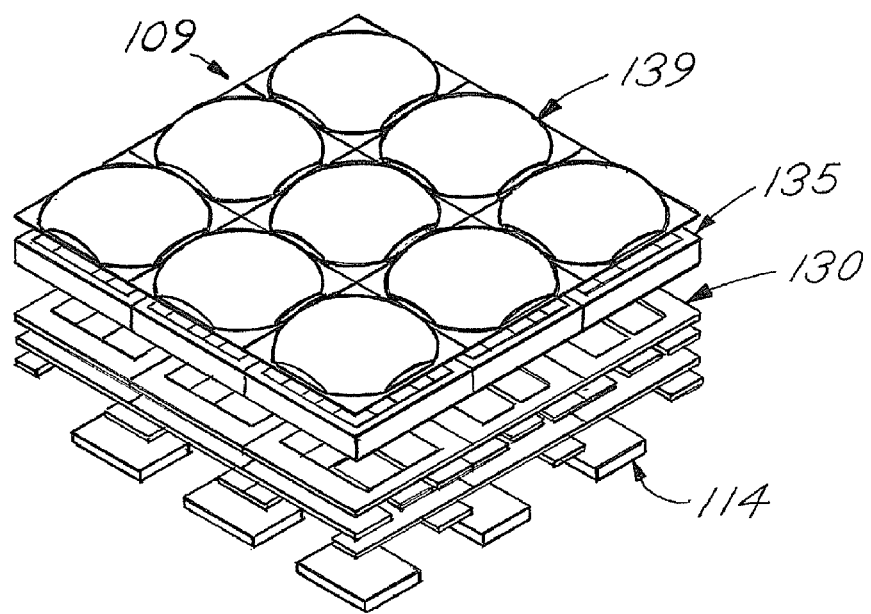
FIGS. 2b, 2c and 2d are a front, perspective and side view of the portion in FIG. 2a, respectively
Figure 2B:
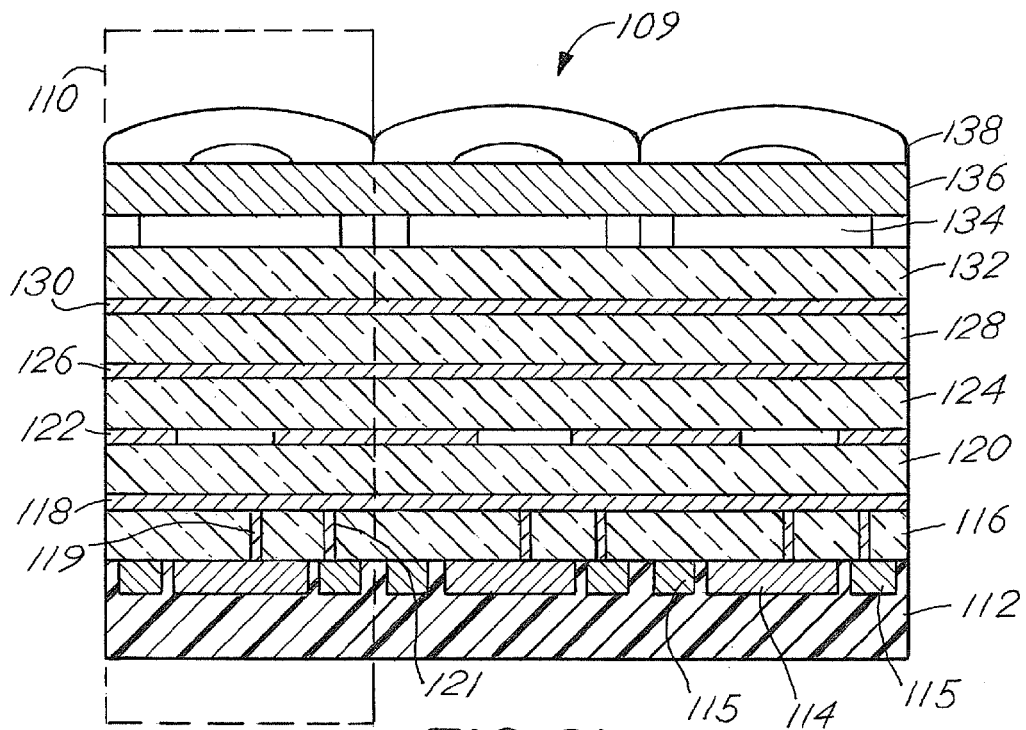
Figure 2D:
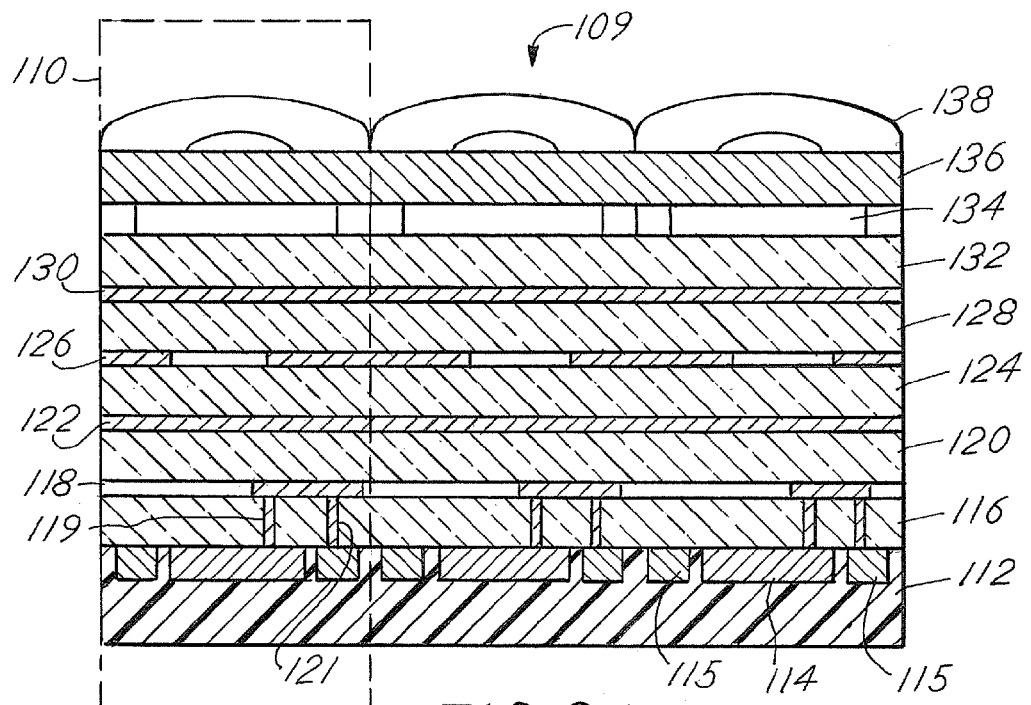

The sensor die 108, a type of CMOS image sensor, is a piece of silicon that includes an integrated circuit (IC) to function as an image sensor. The IC comprises a processing area and a sensing area that may have from several hundred thousands to millions of identical sensor pixels. Hereinafter, for simplicity, the sensor die 108 refers to its sensing area only. FIG. 2a is a top view of a portion 109 of the silicon die 108 in accordance with one embodiment of the present teachings, where only 9 sensor pixels 110 are shown for simplicity. FIGS. 2b and 2d are the front and side views of the portion 109 in FIG. 2a, respectively, showing multiple layers 112-138 of the silicon die 108. FIG. 2c is a perspective view of the portion 109 in FIG. 2a, focusing on several key features of the layers.

As shown in FIGS. 2b-2d, each pixel 110 includes: a silicon substrate layer 112; a photodiode 114 forming a portion of and being underneath the surface of the silicon substrate layer 112; a plurality of passive components 115 (such as transistors, resistors and capacitors) underneath the surface of the silicon substrate layer 112; four transparent insulating layers 116, 120, 124 and 128; four metal layers 118, 122, 126 and 130, the four metal layers being insulated by the four transparent insulating layers 116, 120, 124 and 128, and connected to the photodiode 114 and/or the plurality of passive elements 115; a first planar layer 132, the first planar layer being a transparent insulating layer and having a flat top surface; a color filter 134 for passing a specific wavelength or wavelength band of light to the photodiode 114; and a microlens 138 for focusing light rays to the photodiode 114. A microlens array 139 in FIG. 2c comprises the identical microlens 138.

In one embodiment of the present teachings, the photodiode 114 and the plurality of passive elements 115 may be formed by a semiconductor etching process, i.e., etching the surface of the silicon substrate layer 112 and chemically depositing intended types of material on the etched area to form the photodiode 114 and the plurality of passive elements 115.

As mentioned, the color filter 134 filters light rays (such as 104 in FIG. 1) directed to its corresponding photodiode 114 and transmits light rays of only one wavelength or wavelength band. In one embodiment of the present teachings, a RGB color system may be used, and consequently, a color filter array (CFA) 135 (shown in FIG. 2C) comprises three types of filters 134. In the RGB system, signals from three pixels are needed to form one complete color. However, it is noted that the number of types of filters in the CFA 135 can vary depending on the color system applied to the silicon die 108.

The metal layers 118, 122, 126 and 130 function as connecting means for the photodiodes 114 and passive components 115 to the processing area of the silicon die 108, where the signals from the photodiodes and passive components are transmitted using a column transfer method. In FIGS. 2c and 2d, for the purpose of illustration, exemplary connections 119 and 121 are shown, where the connections 119 and 121 link the metal layer 118 to the photodiode 114 and one of the passive components 115, respectively. However, it should be apparent to the one of ordinary skill that connections between the four metal layers (118, 122, 126 and 130) and the photodiode 114 and the passive components 115 can vary depending on the overall layout of the silicon die 108. Also, the number of metal layers depends on the complexity of the layout of metal layers and, as a consequence, a different layout of the silicon die may have different number of metal layers.

Figure 3:
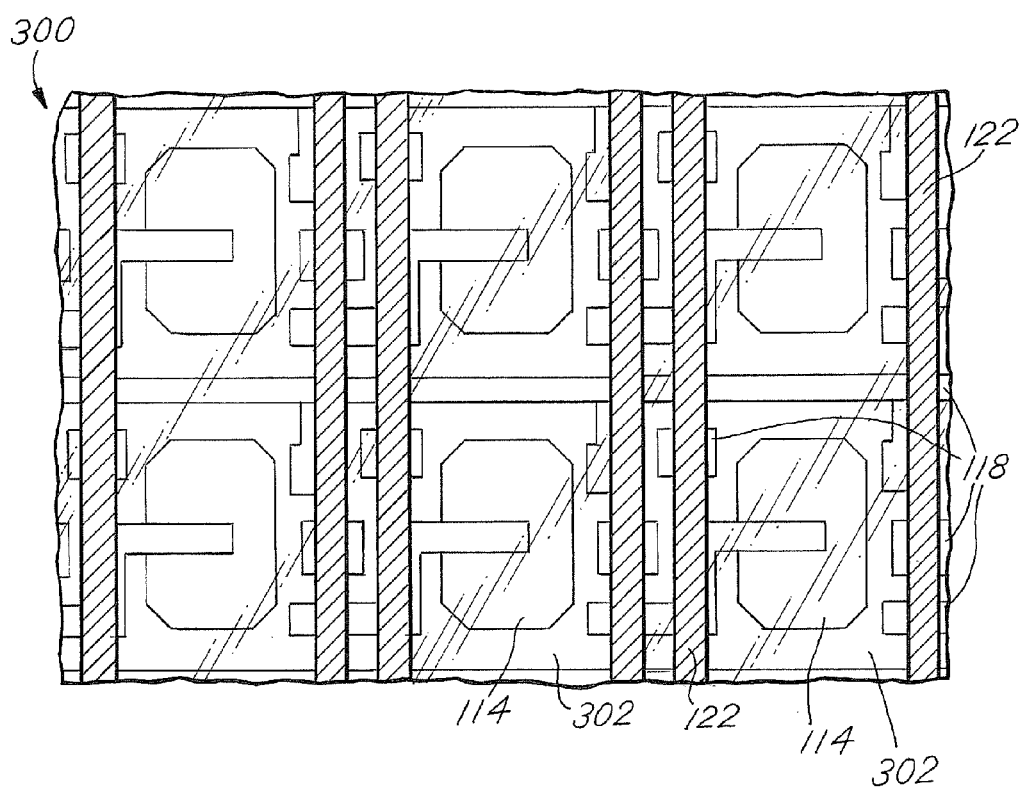
FIG. 3 is a detailed layout of two metal layers and photodiodes in accordance with one embodiment of the present teachings.

FIG. 3 is a detailed layout 300 of the metal layers and photodiodes of the silicon die 108 in accordance with one embodiment of the present teachings, where a top view of only two metal layers 118, 122 and photodiodes 114 are shown for simplicity. The metal layers 118 and 122 may be formed of an opaque material, such as aluminum, and define the shape of openings 302 through which the light rays directed to each photodiode 114 are collected. As shown in FIG. 3, the shape of the opening 302 may not have any axis of symmetry. Tn addition, the layout of two other metal layers 126 and 130, when superimposed on top of the layout 300, would make the opening 302 be further non-symmetric. The effective light collecting area of the non-symmetric opening 302 varies as the angle of light rays with respect to the surface normal of the opening 302 changes. Consequently, the intensity of electric signal from the photodiode 114 may be a function of the chief ray angle 106 (shown in FIG. 1).

Figure 4A:
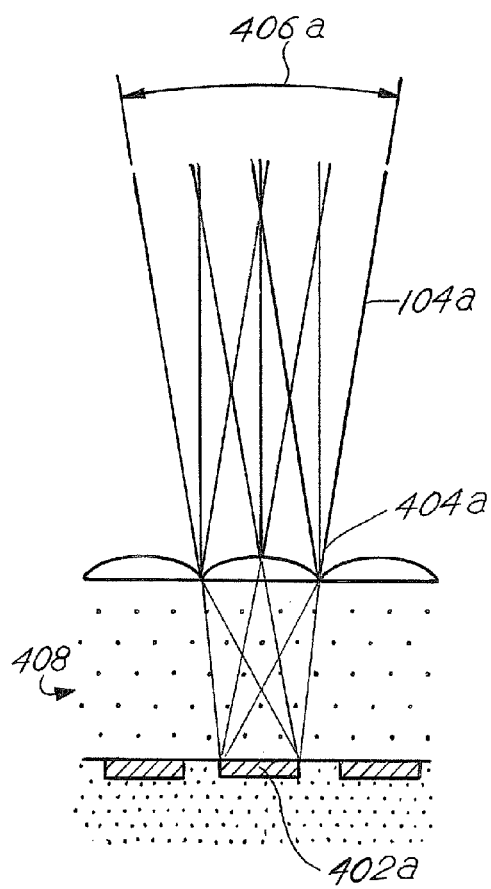
FIGS. 4a and 4b illustrate ray acceptance angles for a sensor with a non-shifted microlens array.
Figure 4B:
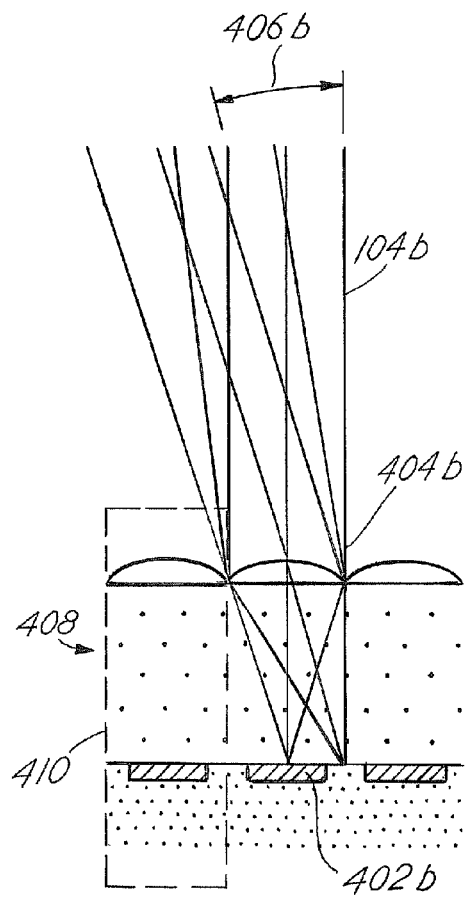
Figure 5:
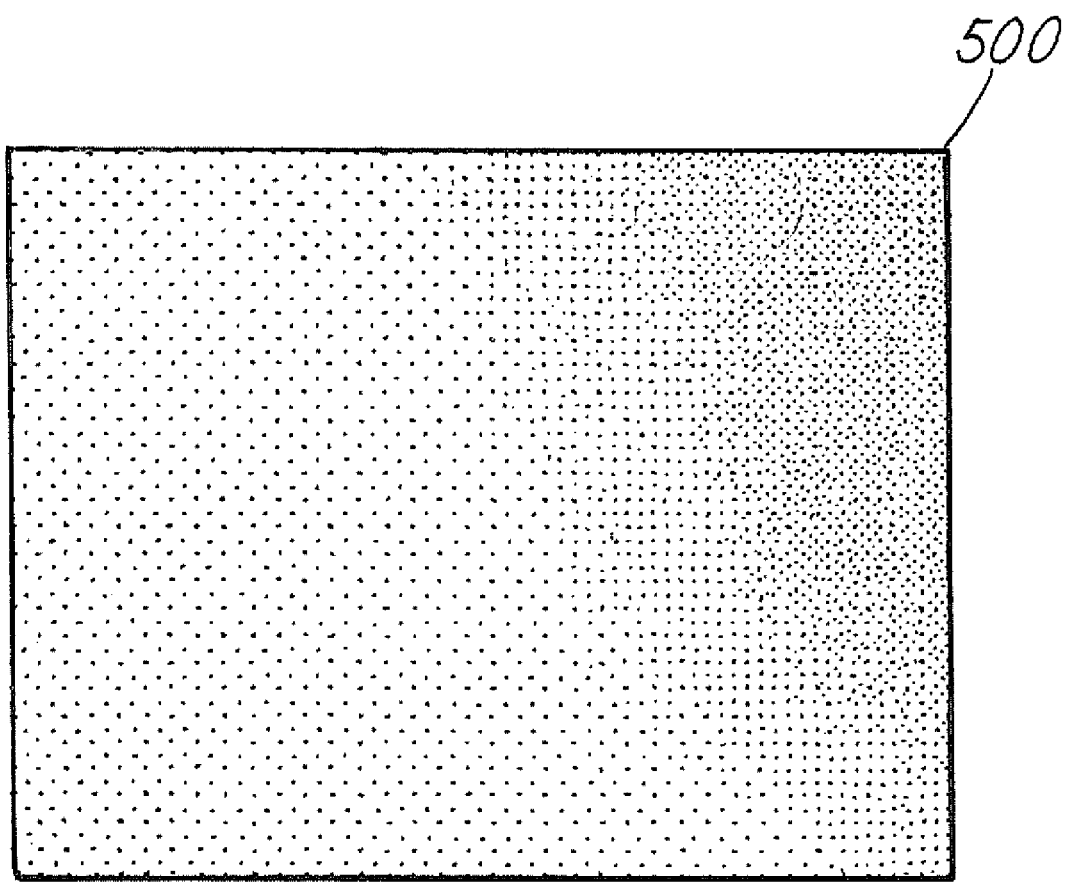
FIG. 5 is an image of a white light source captured by an image sensor having a sensor die, where the brightness of the image is non-uniform across the sensor die.

As illustrated in FIG. 1, each of the optical rays 104a-c is angled with respect to the surface normal of the sensor die 108. FIGS. 4a and 4b illustrate ray acceptance angles 406 for a sensor die 408 with a non-shifted microlens array 404, where the optical axis of a microlens in each pixel 410 coincides with the optical axis of a photodiode 402 in the pixel. (Hereinafter, the optical axis of a photodiode refers to an axis normal to the surface of the photodiode and passes through the geometric center of the photodiode.) In FIGS. 4a-b, for simplicity, only photodiodes 402 and a microlens array 404 are shown. As illustrated in FIG. 4a, most of the light rays 104a are collected by a photodiode 402a that is located at the center of the sensor die 408. Thus, the light ray acceptance angle 406a is same as that of incoming light rays 104a. In contrast, as shown in FIG. 4b, some portion of the optical rays 104b are not collected by a photodiode 402b that is located near the right edge of the silicon die 408, i.e., the photodiode 402b has a limited ray acceptance angle 406b. Such limited ray acceptance angle, when combined with the non-symmetric nature of the opening 302, may result non-uniform brightness distribution of an image on the sensor die 408, as shown in FIG. 5. FIG. 5 shows an image 500 of a white light source captured by an image sensor having the sensor die 408, where the brightness of image 500 is non-uniform across the sensor die 408. In addition, the image 500 may not be a color balanced, i.e., the color of the image is not white over the entire sensor die.

Figure 6A:
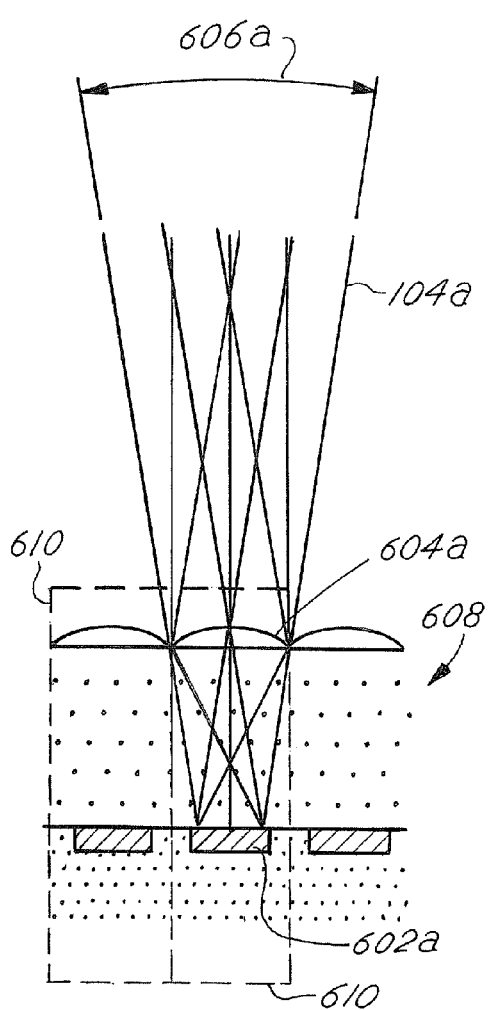
FIGS. 6a and 6b illustrate ray acceptance angles for a sensor with a shifted microlens array in accordance with one embodiment of the present teachings.
Figure 6B:
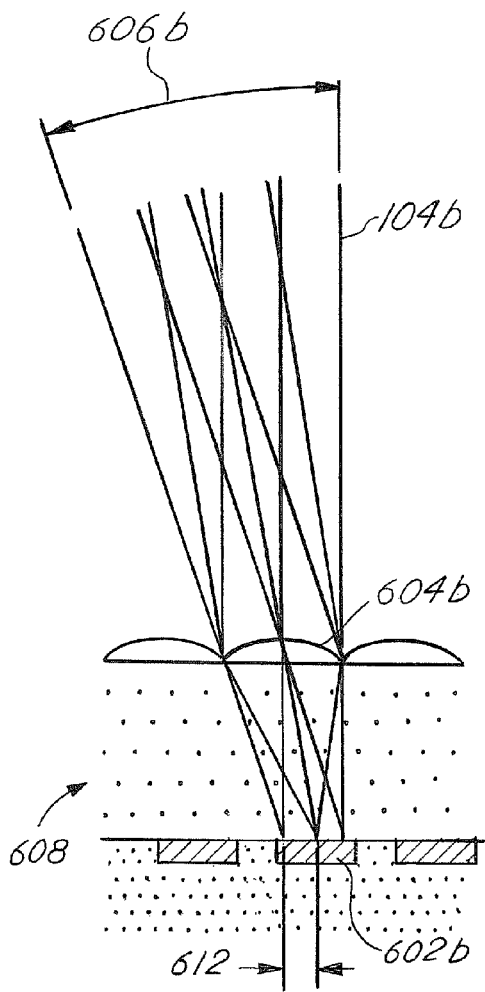

FIGS. 6a and 6b illustrate ray acceptance angles 606 for a sensor die 608, where the optical axis of a microlens 604 in each pixel 610 has been shifted with respect to the optical axis of a photodiode 602 of the pixel in accordance with one embodiment of the present teachings. In FIG. 6a, the optical axis of a microlens 604a in a pixel coincides with the optical axis of a photodiode 602a of the same pixel, where the pixel is located at the center of the sensor die 608. However, as shown in FIG. 6b, the optical axis of a microlens 604b in a pixel located near the right edge of the sensor die 608 has been shifted by a distance 612 with respect to the optical axis of a photodiode 602b in an effort to improve the ray acceptance angle 606b. The light ray acceptance angles 606a and 606b are equal to those of the incoming light rays 104a and 104b, respectively.

In this embodiment, a pre-simulation has been performed to calculate the distance 612 for each pixel 610 and simulate the ray acceptance angles 606 by a basic optical method, such as a conventional optical ray trace technique. Based on the calculated distance 612, a "shrink-factor" is calculated, where the shrink-factor is the ratio of the dimension of the microlens array 604 to that of the silicon die 608. Hereinafter, the term "shrinking" means reducing the size of microlens array 604 based on the calculated shrink-factor. Actual shrinking is realized by reducing the area of each microlens and gaps between neighboring microlenses, while the thickness of the microlens may be kept unchanged. As the microlens array 604 is formed using a photo-mask in a photo-processing of the silicon die 608, shrinking is implemented by scaling the photo-mask.

Figure 7:
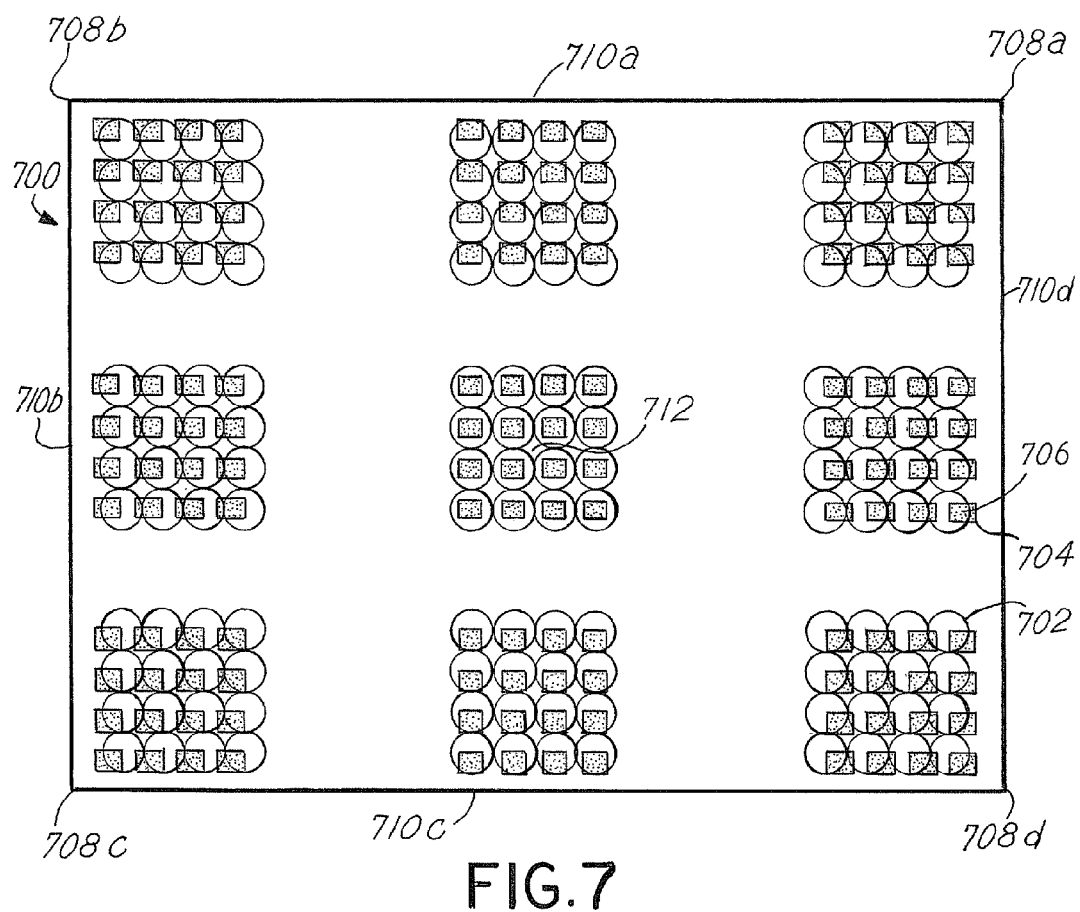
FIG. 7 is a top view of a sensor die with a microlens array, elements of which are shifted to achieve ray angle match over the entire sensor die in accordance with one embodiment of the present teachings.

FIG. 7 is a top view of a sensor die 700 with a microlens array 702, the elements of which are shifted to achieve ray angle match over the entire sensor die 700 in accordance with one embodiment of the present teachings. (In FIG. 7, for simplicity, only the array of microlenses 702 and photodiodes 704 are shown.) As shown in FIG. 7, each microlens 702 has been shifted toward the center 712 of the sensor die 700 so that each of light spots 706 is located within the corresponding photodiode 704, which improves the ray acceptance angle, and subsequently, the brightness distribution of image on the silicon die 700. The shifting of each microlens is more pronounced near sensor edges 710 and corners 708 than the center 712. As mentioned above, the shifting of each microlens is implemented by scaling a photo mask of the microlens array 702.

The pre-simulation based on the optical ray trace technique may not provide a perfect prediction of the optical characteristics of the pixels due to the complexity of the layout of the silicon die. Also, the accuracy of the pre-simulation is limited as the pixel size keeps shrinking. Furthermore, it is quite difficult, if not possible, to simulate the effects of additional factors that may contribute to simulation error. The factors include; chemical contamination occurred during the CMOS process for producing a silicon die; electrical field generated by metal layers; and imperfect masks used in the CMOS process as well as other unknown sources. Thus, upon completion of shrinking based on the pre-simulation and production of a sample product of the silicon die, an image of a collimated white light source captured by the sample product should be analyzed to access any error in the sample silicon die's alignment and image center offset (or, equivalently, de-centering value). If the brightness distribution of the captured image of the collimated white light source is not satisfactory, further adjustment via an iteration process may be performed.

Figure 8:
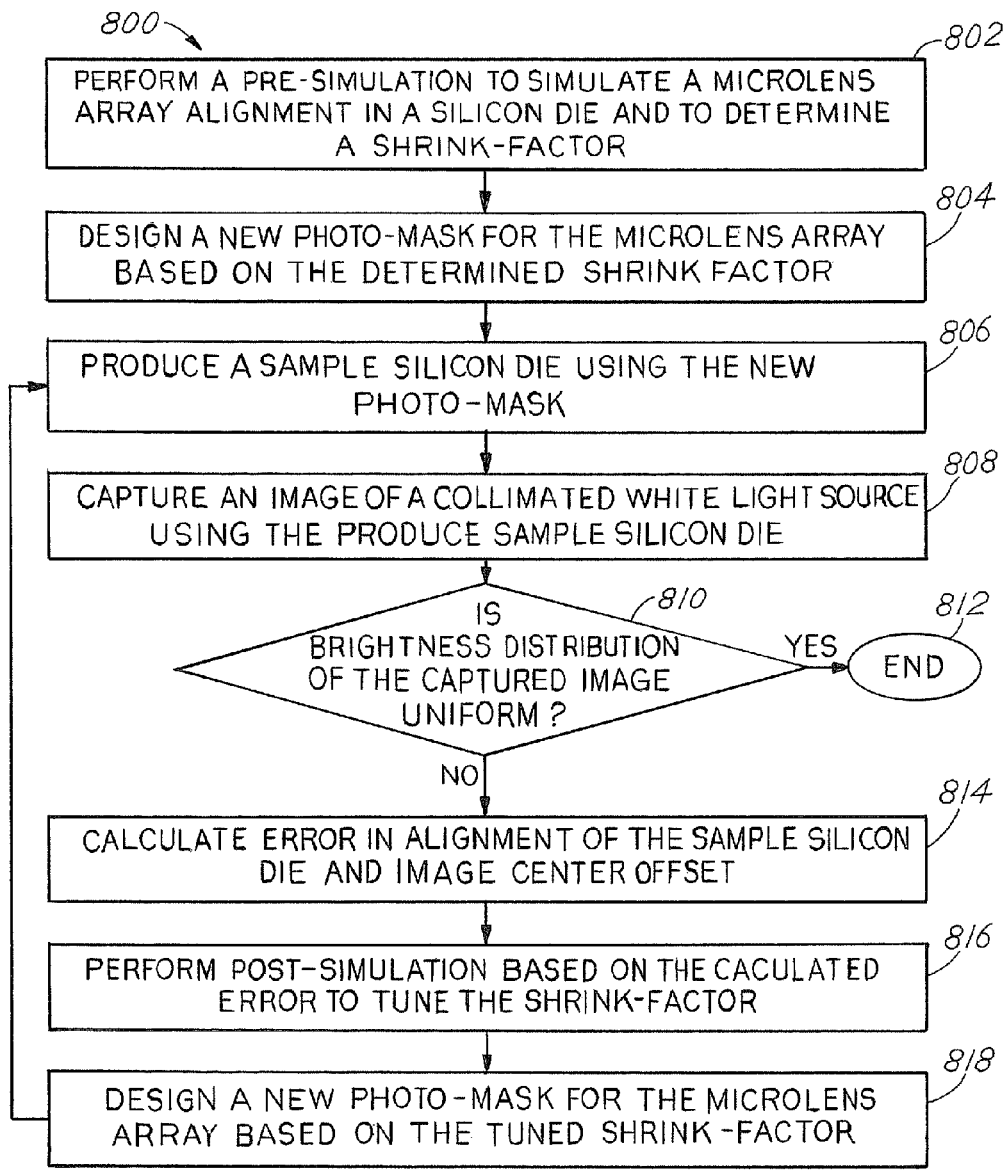
FIG. 8 is a flow chart of an iterative process for aligning a microlens array in a sensor die in accordance with one embodiment of the present teachings.

FIG. 8 is a flow chart 800 of an iterative process for aligning a microlens array in a sensor die in accordance with one embodiment of the present teachings. At step 802, a pre-simulation is performed to simulate a microlens array alignment and to determine a shrink-factor as described above. Based on the shrink-factor, a new photo-mask for the microlens array is designed at step 804. Next, a sample silicon die is produced using the new photo-mask at step 806. Subsequently, an image of a collimated white light source is captured by the produced sample silicon die at step 808. At step 810, the uniformity of brightness distribution on the captured image is evaluated. In this step, the distribution of both intensity and color balance of the image are evaluated. In case of unsatisfactory distribution, the error in alignment of the sample silicon die and image center offset can be calculated at step 814. Next, at step 816, based on the calculated error, post-simulation may be performed in the same manner as the pre-simulation of step 802 to tune the shrink-factor and de-centering values. Subsequently, a new photo-mask for the microlens array is designed based on the tuned shrink-factor at step 818 and the steps 806-818 are repeated until a satisfactory image is obtained to end the iterative process at step 812.

Figure 9:
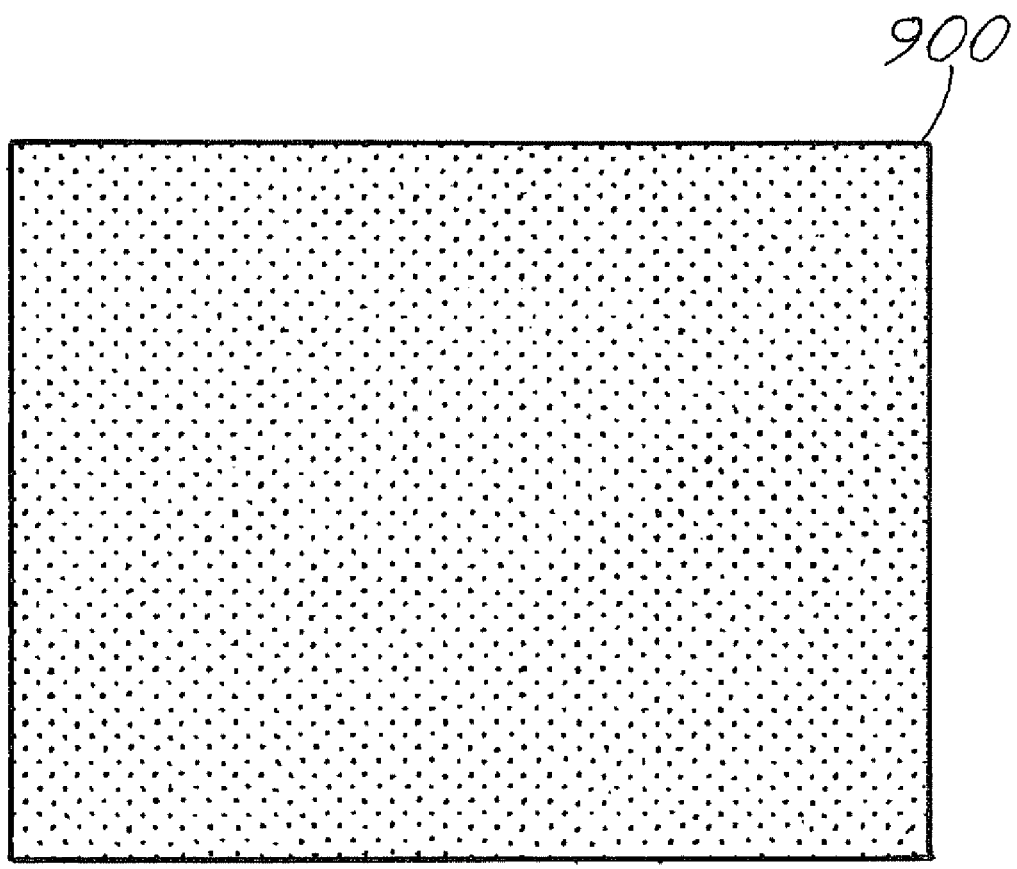
FIG. 9 shows an image captured by a sensor die having a microlens array aligned with de-centering offset following the steps in FIG. 8.

FIG. 9 shows an image 900 captured by a sensor die having a microlens array aligned with de-centering following the steps in FIG. 8. As can be noticed, the image 900 shows enhanced uniformity of brightness and symmetric color balance over the entire sensor die compared to the image 500 in FIG. 5. Thus, the iteration process, the steps 806-818 of FIG. 8, allows a sensor designer to tune the shrink-factor in a high precision and effectively improve the image quality.

Those skilled in the art will appreciate that the methods and designs described above have additional applications and that the relevant applications are not limited to those specifically recited above. It should be understood that the foregoing relates to exemplary embodiments of the invention and that modifications may be made without departing from the spirit and scope of the invention as set forth in the following claims

What is claimed is:

1. A method, comprising:
capturing an image using a first image sensor having a first microlens array formed using a first photo-mask;
generating one or more correction parameters by evaluating the captured image;
creating a second photo-mask based on the first photo-mask and the one or more correction parameters; and
using the second photo-mask to form a second microlens array of a second image sensor.

2. The method of claim 1, further comprising:
using a collimated white light source to produce the image captured by the first image sensor.

3. The method of claim 2, wherein said evaluating the captured image comprises evaluating a uniformity of brightness distribution of the captured image.

4. The method of claim 2, wherein:
said generating one or more correction parameters comprises determining a shrink-factor and a de-centering value based on a uniformity of brightness distribution of the captured image; and
said creating a second photo-mask comprises:
shrinking the first photo-mask based on the shrink-factor; and
de-centering the first photo-mask based on the de-centering value.

5. The method of claim 1, wherein:
said generating one or more correction parameters comprises determining a shrink-factor from the captured image; and
said creating a second photo-mask comprises shrinking the first photo-mask based on the shrink-factor.

6. The method of claim 1, wherein:
said generating one or more correction parameters comprises determining a de-centering value from the captured image; and
said creating a second photo-mask comprises de-centering the first photo-mask based on the de-centering value.

7. The method of claim 1, wherein:
said generating one or more correction parameters comprises determining a shrink-factor and a de-centering value from the captured image; and
said creating a second photo-mask comprises:
shrinking the first photo-mask based on the shrink-factor; and
de-centering the first photo-mask based on the de-centering value.

8. An article of manufacture including a computer-readable medium having instructions stored thereon that, in response to execution by a computing device, cause the computing device to perform operations comprising:
receiving image data captured by a first image sensor having a first microlens array formed using a first photo-mask design;
calculating an error in alignment between the first image sensor and the first microlens array based on the image data;
determining a shrink-factor based on the calculated error in alignment; and
generating a second photo-mask design that corresponds to the first photo-mask design shrunken by the shrink-factor.

9. The article of manufacture of claim 8, wherein said calculating an error in alignment comprises evaluating a uniformity of brightness distribution of the image data.

10. The article of manufacture of claim 8, wherein said generating a second photo-mask design comprises shrinking the first photo-mask design based on the shrink-factor.

11. The article of manufacture of claim 8, wherein:
said calculating an error in alignment comprises determining a de-centering value from the image data; and
said generating a second photo-mask design comprises de-centering the first photo-mask design based on the de-centering value.

12. The article of manufacture of claim 8, wherein:
said calculating an error in alignment comprises determining a de-centering value from the image data; and
said generating a second photo-mask design comprises:
shrinking the first photo-mask design based on the shrink-factor; and
de-centering the first photo-mask design based on the de-centering value.

13. A method, comprising:
using a first photo-mask design to form a first microlens array on a first sensor die;
determining a de-centering value based on image data from the first image sensor;
de-centering the first photo-mask design based on the de-centering value to obtain a second photo-mask design; and
using the second photo-mask design to form a second microlens array on a second sensor die.

14. The method of claim 13, further comprising:
using a collimated white light source to produce an image;
capturing the image with the first image sensor; and
generating the image data based on the captured image.

15. The method of claim 14, wherein said determining a de-centering value comprises evaluating a uniformity of brightness distribution of the captured image.

16. The method of claim 13, further comprising:
determining a shrink-factor based on the image data; and
shrinking the first photo-mask design based on the shrink-factor to obtain the second photo-mask design.

17. A system, comprising:
an image source configured to produce an image; and
a computing device configured to:
receive image data generated by a first image sensor in response to capturing the image;
determine, based on the image data, one or more correction parameters for a first photo-mask design used to form a first microlens array on the first image sensor; and
create a second photo-mask design for a second microlens array on a second image sensor based on the first photo-mask design and the determined one or more correction parameters.

18. The system of claim 17, wherein the image source comprises a collimated white light source.

19. The system of claim 18, wherein the computing device is further configured to determine the one or more correction parameters based on a uniformity of brightness distribution of the captured image.

20. The system of claim 18, wherein the computing device is further configured to:
determine a shrink-factor and a de-centering value of the one or more correction parameters based on a uniformity of brightness distribution of the captured image;
shrink the first photo-mask based on the shrink-factor; and
de-center the first photo-mask based on the de-centering value.

21. The system of claim 17, wherein the computing device is further configured to:
determine a shrink-factor of the one or more correction parameters from the captured image; and
shrink the first photo-mask design based on the shrink-factor.

22. The system of claim 17, wherein the computing device is further configured to:
determine a de-centering value of the one or more correction parameters from the captured image; and
de-center the first photo-mask design based on the de-centering value.

23. The system of claim 17, wherein the computing device is further configured to:
determine a shrink-factor and a de-centering value of the one of more correction parameters from the captured image;
shrink the first photo-mask based on the shrink factor; and
de-center the first photo-mask based on the de-centering value.

* * * * *

UNITED STATES PATENT AND TRADEMARK OFFICE
CERTIFICATE OF CORRECTION

PATENT NO. : 8,068,284 B2
APPLICATION NO. : 12/489147
DATED : November 29, 2011
INVENTOR(S) : Feng It is certified that error appears in the above-identified patent and that said Letters Patent is hereby corrected as shown below:

In Column 1, Line 65, delete "of" and insert -- of: --, therefor.

In Column 3, Line 39, delete "respectively" and insert -- respectively. --, therefor.

In Column 5, Line 62, delete "Tn" and insert -- In --, therefor.

In Column 7, Line 67, delete "claims" and insert -- claims. --, therefor.

In Column 10, Line 38, in Claim 23, delete "one of" and insert -- one or --, therefor.

Signed and Sealed this
Twelfth Day of June, 2012

David J. Kappos
*Director of the United States Patent and Trademark Office*